US012230484B2

(12) United States Patent
Harikai et al.

(10) Patent No.: US 12,230,484 B2
(45) Date of Patent: Feb. 18, 2025

(54) PLASMA PROCESSING APPARATUS AND PLASMA PROCESSING METHOD

(71) Applicant: Panasonic Intellectual Property Management Co., Ltd., Osaka (JP)

(72) Inventors: Atsushi Harikai, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 213 days.

(21) Appl. No.: 17/937,512

(22) Filed: Oct. 3, 2022

(65) Prior Publication Data

US 2023/0114557 A1    Apr. 13, 2023

(30) Foreign Application Priority Data

Oct. 13, 2021  (JP) .................................. 2021-168353
Oct. 13, 2021  (JP) .................................. 2021-168354

(51) Int. Cl.
*H01J 37/32*      (2006.01)

(52) U.S. Cl.
CPC .. *H01J 37/32733* (2013.01); *H01J 37/32724* (2013.01); *H01J 2237/3341* (2013.01)

(58) Field of Classification Search
None
See application file for complete search history.

(56) References Cited

U.S. PATENT DOCUMENTS

| 9,502,220 | B2 * | 11/2016 | Okita | H01J 37/32651 |
| 10,147,646 | B2 * | 12/2018 | Karasaki | B23K 26/0622 |
| 10,361,111 | B2 * | 7/2019 | Okita | H01L 22/20 |
| 10,410,924 | B2 * | 9/2019 | Karasaki | B23K 26/062 |
| 10,790,125 | B2 * | 9/2020 | Kuboi | H01L 21/31144 |
| 10,923,357 | B2 * | 2/2021 | Itou | H01L 21/68735 |
| 2010/0132614 | A1 * | 6/2010 | Kato | C23C 16/45551 |
| | | | | 118/723 R |
| 2018/0174908 | A1 * | 6/2018 | Karasaki | B23K 26/402 |
| 2018/0197777 | A1 * | 7/2018 | Karasaki | H01L 21/02076 |

(Continued)

FOREIGN PATENT DOCUMENTS

| CN | 105390359 A * | 3/2016 | ........ H01J 37/32366 |
| CN | 105895488 A * | 8/2016 | ......... C23C 16/4586 |

(Continued)

*Primary Examiner* — Srinivas Sathiraju
(74) *Attorney, Agent, or Firm* — MCDONALD HOPKINS LLC

(57) ABSTRACT

A plasma processing apparatus including: a chamber; a plasma generation unit configured to generate a plasma in the chamber; a stage 111 for placing a conveying carrier 10, the stage provided in the chamber; a cover 124 for covering at least part of the conveying carrier placed on the stage; a relative position change unit capable of changing a relative distance between the cover 124 and the stage 111 to a first distance and to a second distance smaller than the first distance; a determination unit configured to determine a placed state of the conveying carrier 10; and a control unit. The determination unit determines the placed state of the conveying carrier while the distance between the cover 124 and the stage 111 is the first distance, and the plasma processing is performed while the distance between the cover 124 and the stage 111 is the second distance.

15 Claims, 11 Drawing Sheets

(56) References Cited

U.S. PATENT DOCUMENTS

| | | | |
|---|---|---|---|
| 2018/0240678 A1* | 8/2018 | Itou | H01L 21/7806 |
| 2018/0240697 A1* | 8/2018 | Okita | H01J 37/32816 |
| 2019/0237310 A1* | 8/2019 | Kuboi | H01L 21/31116 |
| 2023/0114557 A1* | 4/2023 | Harikai | H01J 37/32724 |
| | | | 315/111.21 |

FOREIGN PATENT DOCUMENTS

| | | | | |
|---|---|---|---|---|
| CN | 104616957 B | * | 7/2018 | ............ H01J 37/321 |
| JP | 2014-513868 A | | 6/2014 | |
| WO | 2012/125560 A2 | | 9/2012 | |
| WO | WO-2018074087 A1 | * | 4/2018 | ........ H01J 37/32009 |

\* cited by examiner

PLASMA PROCESSING APPARATUS AND PLASMA PROCESSING METHOD

CROSS REFERENCE TO RELATED APPLICATION

The present application is based on and claims priority under 35 U.S.C. § 119 with respect to the Japanese Patent Application Nos. 2021-168353 and 2021-168354 both filed on Oct. 13, 2021, of which entire contents are incorporated herein by reference into the present application.

TECHNICAL FIELD

The present invention relates to a plasma processing apparatus and a plasma processing method, particularly to a plasma processing method for plasma processing a substrate held on a holding sheet.

BACKGROUND

One known method for dicing a substrate is plasma dicing. In plasma dicing, a substrate (wafer) having a resist mask formed thereon is etched with plasma, to be diced into individual chips.

Patent Literature 1 (JP2014-513868A) discloses a method for plasma dicing a substrate, the method including providing a workpiece support within a process chamber, placing a substrate on a carrier support to form a workpiece, loading the workpiece onto the workpiece support, disposing a cover ring above the workpiece, generating a plasma using a plasma source, and etching the workpiece with the generated plasma.

A substrate is usually attached to a holding sheet having one side provided with an adhesive for securing the substrate. The holding sheet is also called a dicing tape. For ease of handling, the substrate is held on a conveying carrier (carrier support) having a holding sheet and a frame disposed at the outer peripheral portion of the holding sheet, and in this state, placed on a stage in a plasma processing apparatus and subjected to a plasma processing. A protective cover made of a dielectric covers the frame and the exposed portion of the holding sheet, in order to prevent the conveying carrier from being directly exposed to plasma and damaged.

The larger the distance between the protective cover and the conveying carrier, the more likely an electrical discharge is to occur in the space between the protective cover and the holding sheet, tending to damage the tape. To address this, the protective cover is disposed in proximity to the conveying carrier. The distance between the protective cover and the holding sheet is, for example, about 2 mm.

On the other hand, in securing the conveying carrier onto the stage, the substrate or holding sheet is, in some cases, secured on the stage with a portion lifted or wrinkled. If the protective cover is lowered while the substrate or holding sheet is lifted, it may occur that the protective cover comes in contact with the holding sheet and damage the tape. Moreover, as a result of being subjected to a plasma processing while lifted, the substrate may fail to be sufficiently cooled by the stage, reaching a high temperature, or may be damaged or broken. Furthermore, the plasma etching may fail to be uniformly applied, causing the processing variations to increase.

SUMMARY

One aspect of the present invention relates to a plasma processing apparatus for performing a plasma processing on a substrate held on a conveying carrier having a frame and a holding sheet, the plasma processing apparatus including: a chamber; a plasma generation unit configured to generate a plasma in the chamber; a stage for placing the conveying carrier, the stage provided in the chamber; a cover for covering at least part of the conveying carrier placed on the stage; a relative position change unit capable of changing a relative distance between the cover and the stage to a first distance and to a second distance smaller than the first distance; a determination unit configured to determine a placed state of the conveying carrier; and a control unit configured to control the plasma generation unit and the relative position change unit, wherein the determination unit determines the placed state of the conveying carrier while the distance between the cover and the stage is the first distance, and the plasma processing is performed while the distance between the cover and the stage is the second distance.

Another aspect of the present invention relates to a plasma processing method, including: a placement step of placing a substrate held on a conveying carrier having a frame and a holding sheet, on a stage provided in a plasma processing apparatus, the plasma processing apparatus including a chamber, a plasma generation unit configured to generate a plasma in the chamber, the stage for placing the conveying carrier, and a cover for covering at least part of the conveying carrier placed on the stage; and a determination step of determining a placed state of the conveying carrier while a distance between the cover and the stage is a first distance, wherein when the placed state is determined as being a first state in the determination step, the distance between the cover and the stage is changed to a second distance smaller than the first distance, and then, a plasma is generated in the chamber, to perform a plasma processing by irradiating the generated plasma to the substrate.

Still another aspect of the present invention relates to a plasma processing apparatus for performing a plasma processing on a substrate held on a conveying carrier having a frame and a holding sheet, the plasma processing apparatus including: a chamber; a plasma generation unit configured to generate a plasma in the chamber; a stage provided in the chamber and having a placement surface for placing the conveying carrier; an imaging unit provided outside the chamber and configured to image an imaging region from a first direction intersecting with the placement surface, through a window provided in a side surface of the chamber, the imaging region including a facing region facing the window and corresponding to an inner peripheral sidewall of the frame of the conveying carrier placed on the stage; a control unit configured to control the plasma generation unit and the imaging unit; and a determination unit configured to determine a placed state of the conveying carrier, based on an image data acquired by the imaging unit.

Yet another aspect of the present invention relates to a plasma processing method, including: a placement step of placing a substrate held on a conveying carrier having a frame and a holding sheet, on a stage provided in a plasma processing apparatus, the plasma processing apparatus including a chamber, a plasma generation unit configured to generate a plasma in the chamber, and the stage having a placement surface for placing the conveying carrier; and a determination step of determining a placed state of the conveying carrier, wherein the determination step includes an imaging step of imaging the conveying carrier placed on the stage, the imaging step is a step of imaging an imaging region from a first direction intersecting with the placement surface, through a window provided in a side surface of the chamber, by an imaging unit provided outside the chamber, the imaging region including a facing region facing the window and corresponding to an inner peripheral sidewall of the frame of the conveying carrier placed on the stage, and in the determination step, the placed state is determined based on an image data acquired in the imaging step.

According to the present invention, it is possible to prevent a plasma processing from being performed while the substrate or the holding sheet is lifted from the stage, and thus to improve the substrate yield and the production efficiency.

DETAILED DESCRIPTION

Figure 1A:
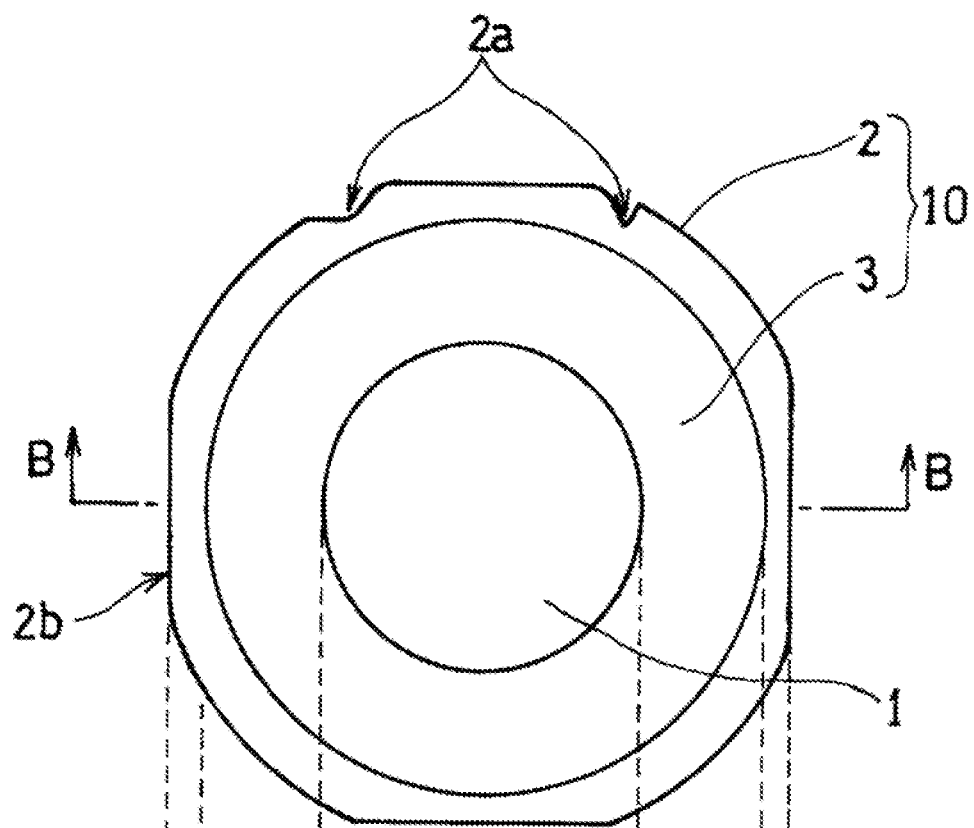
FIG. 1A is a schematic top view of a conveying carrier and a substrate held thereon according to an embodiment of the present invention.

A plasma processing apparatus according to one embodiment of the present invention is for performing a plasma processing on a substrate held on a conveying carrier having a frame and a holding sheet, and includes: a chamber; a plasma generation unit configured to generate a plasma in the chamber; a stage for placing the conveying carrier, the stage provided in the chamber; and a cover for covering at least part of the conveying carrier placed on the stage. The plasma processing apparatus further includes a relative position change unit capable of changing a relative distance between the cover and the stage to a first distance and to a second distance smaller than the first distance, a determination unit configured to determine a placed state of the conveying carrier, and a control unit configured to control the plasma generation unit and the relative position change unit.

The determination unit determines the placed state of the conveying carrier, while the distance between the cover and the stage is the first distance. On the other hand, while the distance between the cover and the stage is the second distance, a plasma processing is performed. In other words, the determination of the placed state of the conveying carrier by the determination unit is performed while the distance between the cover and the stage is greater than the distance during the plasma processing, that is, while the cover is sufficiently distanced from the conveying carrier. This can prevent the occurrence of errors in subsequent processing that may occur when the placed state is defective. For example, it is possible to avoid a conveying error that may occur when the placed state is defective, due to contacting with the cover, in unloading the conveying carrier. As a result, the substrate yield and the production efficiency can be improved.

The determination unit determines whether the placed state of the conveying carrier corresponds to a first state or a second state. In the first state, the placement is good, and in the second state, the placement is defective.

The determination of the placed state of the conveying carrier by the determination unit may be performed based on an image data obtained by imaging the placed state of the conveying carrier on the stage. Preferably, the plasma processing apparatus further includes an imaging unit configured to image the conveying carrier placed on the stage. The determination unit can determine the placed state, based on an image data acquired by the imaging unit while the distance between the cover and the stage is the first distance.

In this case, the determination of the placed state may be done based on the condition of an inner peripheral sidewall of the frame of the conveying carrier. For example, the imaging unit images the placed state of the conveying carrier including the inner peripheral sidewall of the frame, from a direction slightly inclined against the placement surface of the conveying carrier (principal surface of the substrate). When made of a metal material, the frame will reflect light, and can be easily identified from the substrate or the holding sheet by image analysis from the image data. Here, when the substrate or the holding sheet is partially lifted from the stage, the inner peripheral sidewall of the frame is hidden behind the lifted portion of the substrate or the holding sheet when viewed from the direction slightly inclined against the principal surface of the substrate, which makes it difficult to identify the frame in the image data. Therefore, based on the condition of the inner peripheral sidewall of the frame in the image data, the placed state of the conveying carrier can be easily determined.

When the placed state is determined as being the first state (good) by the determination unit, the control unit controls the relative position change unit so as to change the distance between the cover and the stage to the second distance, and then controls the plasma generation unit so as to generate a plasma. Using the generated plasma, the plasma processing is performed. On the other hand, when the placed state is determined as being the second state (defective) by the determination unit, the control unit controls, without changing the distance between the cover and the stage to the second distance, to place the conveying carrier on the stage again while the distance between the cover and the stage is greater than the second distance. In this case, the placement step is retried while the conveying carrier and the cover are sufficiently distanced from each other. Therefore, an error caused due to the conveying carrier coming in contact with the cover during the retry operation can be avoided.

A plasma processing apparatus according to another embodiment of the present invention is for performing a plasma processing on a substrate held on a conveying carrier having a frame and a holding sheet, and includes: a chamber; a plasma generation unit configured to generate a plasma in the chamber; a stage provided in the chamber and having a placement surface for placing the conveying carrier; an imaging unit provided outside the chamber and configured to image an imaging region from a first direction intersecting with the placement surface, through a window provided in a side surface of the chamber, the imaging region including a facing region facing the window and corresponding to an inner peripheral sidewall of the frame of the conveying carrier placed on the stage; a control unit configured to control the plasma generation unit and the imaging unit; and a determination unit configured to determine a placed state of the conveying carrier, based on an image data acquired by the imaging unit.

The determination of the placed state of the conveying carrier by the determination unit is done based on an image data of the placed state of the conveying carrier on the stage. The determination of the placed state can be done based on the condition of the inner peripheral sidewall of the frame of the conveying carrier. The imaging unit images the placed state of the conveying carrier including the inner peripheral sidewall of the frame, from the first direction which is slightly inclined against the placement surface of the conveying carrier (principal surface of the substrate). When made of, for example, a metal material, the frame will reflects light well, and can be easily identified from the substrate or the holding sheet by image analysis from the image data. Here, when the substrate or the holding sheet is partially lifted from the stage, the inner peripheral sidewall of the frame is hidden behind the lifted portion of the substrate or the holding sheet when viewed from the first direction which is slightly inclined against the principal surface of the substrate, making it difficult to identify the frame in the image data. Therefore, based on the condition of the inner peripheral sidewall of the frame in the image data, the placed state of the conveying carrier can be easily determined.

Hence, the first direction can be set such that the angle formed between the first direction and the placement surface is to be such an angle that when the holding sheet or the substrate has a spaced region where the holding sheet or the substrate is lifted and spaced from the placement surface, imaging by the imaging unit of at least part of the facing region is hindered by the spaced region.

The determination unit determines the placed state of the conveying carrier, based on an information of the facing region included in the image data. The determination unit determines, for example, whether the placed state of the conveying carrier corresponds to a first state or a second state. In the first state, the placement is good, and in the second state, the placement is defective. For example, if the area of the facing region occupying the imaged region is equal to or larger than a predetermined value, the placed state can be determined as being the first state in which the placement is good, and if smaller than the predetermined value, the placed state can be determined as being the second state in which the placement is defective. The information on the facing region can include the area of the facing region, and other information, such as the brightness and the shape of the facing region.

The determination unit may determine the placed state of the conveying carrier, based on an information on the substrate surface included in the image data. Examples of the information on the substrate surface used for determination include the light reflection from the substrate surface and the distortion of a pattern formed on the substrate surface. Specifically, when the holding sheet is wrinkled as a result of the placed state of the conveying carrier being defective, the amount of light reflected from the substrate surface may increase due to wrinkles in some cases. Moreover, when the holding sheet is wrinkled as a result of the placed state of the conveying carrier being defective, the pattern formed on the substrate surface will be distorted due to wrinkles.

When the placed state is determined as being the first state (good) by the determination unit, the control unit controls the plasma generation unit so as to generate a plasma. Using the generated plasma, a plasma processing is performed. On the other hand, when the placed state is determined as being the second state (defective) by the determination unit, the control unit controls, for example, to execute an improvement operation of the placed state, and then, retry the placing of the conveying carrier on the stage. After the improvement operation, the control unit controls to execute again the imaging of the imaging region by the imaging unit and the determination of the placed state of the conveying carrier, based on the image data, by the determination unit. When the placed state is determined as being the first state (good) by the determination unit in the determination executed again, the control unit controls the plasma generation unit so as to generate a plasma.

In this way, by determining the placed state based on the information on the facing region in the image data, it is possible to prevent a plasma processing from being performed, while the holding sheet has a spaced region, such a wrinkle or a lifted portion, and thus to increase the product yield.

As the improvement operation to be performed when the placed state is determined as being in the second state (defective), for example, when using a chuck system for generating a chucking force on the placement surface in securing the conveying carrier onto the stage, the generation of a chucking force by the chuck system and stop of the generation may be repeated a plurality of time. The generation of a chucking force and the stop of the generation may be repeated, while a plasma is generated by the plasma generation unit.

Embodiments of the present invention will be described in detail with reference to the drawings.

Figure 1B:
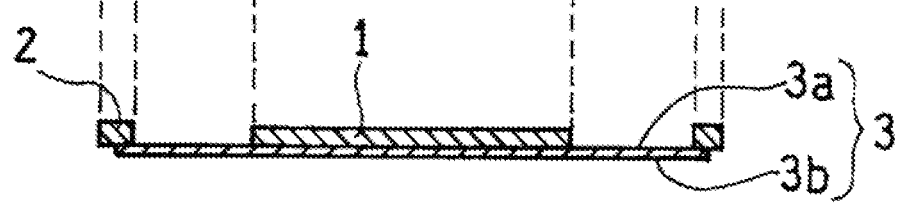
FIG. 1B is a cross-sectional view taken along the line B-B in FIG. 1A.

First, one embodiment of the conveying carrier used in the present invention will be described with reference to FIGS. 1A and 1B. FIG. 1A is a schematic top view of a substrate 1 and a conveying carrier 10 holding the substrate, and FIG. 1B is a cross-sectional view of the substrate 1 and the conveying carrier 10, taken along the line B-B in FIG. 1A. As illustrated in FIG. 1A, the conveying carrier 10 has a frame 2 and a holding sheet 3. The holding sheet 3 is secured at its outer peripheral portion to the frame 2. The substrate 1 is attached to the holding sheet 3 and held on the conveying carrier 10. Although FIG. 1 illustrates the case where both the frame 2 and the substrate 1 are substantially circular, this should not be taken as a limitation.

(Substrate)

The substrate 1 is an object to be plasma-processed. The substrate 1 is produced, for example, by forming a circuit layer, such as a semiconductor circuit, an electronic component element, and MEMS, on one surface of a main body, and then, grinding the back side of the main body opposite to the circuit layer, to reduce the thickness. By singulating the substrate 1, electronic components (not shown) having the circuit layer are obtained.

The substrate 1 may be of any size, and is, for example, about 50 mm to 300 mm in maximum diameter. The thickness of the substrate 1 is usually about 25 to 150 which is very thin. Therefore, the substrate 1 itself has almost no rigidity (self-supporting property). Hence, to the substantially flat frame 2, the holding sheet 3 is secured at its outer peripheral portion, and to this holding sheet 3, the substrate 1 is attached. This can ease the handling, such as transportation, of the substrate 1. The shape of the substrate 1 is also not limited, and is, for example, circular or square. The substrate 1 may be provided with an orientation flat (OF) or a cut-out, such as a notch (both not shown).

The material of the main body of the substrate is also not limited, and may be, for example, a semiconductor, a dielectric, a metal, a laminate thereof, or the like. Examples of the semiconductor include silicon (Si), gallium arsenide (GaAs), gallium nitride (GaN), and silicon carbide (SiC). Examples of the dielectric include a resin film, such as polyimide, a low dielectric film (Low-k film), silicon dioxide ($SiO_2$), silicon nitride ($Si_3N_4$), lithium tantalate ($LiTaO_3$), and lithium niobate ($LiNbO_3$).

On the other surface of the substrate 1, i.e., the surface that is not attached to the holding sheet 3, a mask is formed in a desired shape (not shown). The portion where the mask is formed is protected from etching by plasma. The portion where the mask is not formed can be etched by plasma from the front to the back side. The mask may be, for example, a resist mask formed by exposing to light and developing a resist film. The mask may be formed, for example, by laser scribing a resin film or resin film formed on the surface of the substrate 1, to make an aperture.

(Frame)

The frame 2 is a frame member having an opening equal to or greater in area than the whole substrate 1, and has a predetermined width and a substantially constant thin thickness. The frame 2 has such a rigidity that it can be conveyed with the holding sheet 3 and the substrate 1 held thereon.

The opening of the frame 2 may be of any shape, for example, a circular shape or a polygonal shape, such as a rectangular or hexagonal shape. The frame 2 may be provided with a notch 2a and a corner cut 2b for correct positioning. The frame 2 may be made of, for example, a metal, such as aluminum or stainless steel, or a resin. To one side of the frame 2, the holding sheet 3 is attached at around its outer periphery on one side.

(Holding Sheet)

The holding sheet 3 has a surface with an adhesive (adhesive side 3a) and a surface without an adhesive (non-adhesive side 3b). The adhesive side 3a is attached at its outer periphery to one side of the frame 2, and the opening of the frame 2 is covered. The substrate 1 is attached to a portion where the adhesive side 3a is exposed from the opening of the frame 2.

The adhesive side 3a is preferably made of an adhesive component, the adhesive strength of which is reduced by ultraviolet (UV) irradiation. This allows for easy peeling off and picking up of the singulated substrate (electronic components) by UV-radiation performed after dicing. The holding sheet 3 can be formed, for example, by applying a UV-curing acrylic adhesive in a thickness of 5 to 20 μm on one side of a film-like base material.

The film-like base material may be of any material, and may be a thermoplastic resin including, for example, polyolefin, such as polyethylene and polypropylene, and polyester, such as polyethylene terephthalate. The base material may be blended with various additives including, for example, a rubber component for imparting elasticity (e.g., ethylene-propylene rubber (EPM), ethylene-propylene-diene rubber (EPDM)), a plasticizer, a softener, an antioxidant, and a conductive material. The above thermoplastic resin may have a functional group that reacts during photopolymerization reaction, such as an acryl group. The base material may have a thickness, for example, 50 to 150 In plasma processing, the conveying carrier 10 is placed on the stage such that the non-adhesive side 3b comes in contact with the stage 111.

(Plasma Processing Apparatus)

Figure 2:
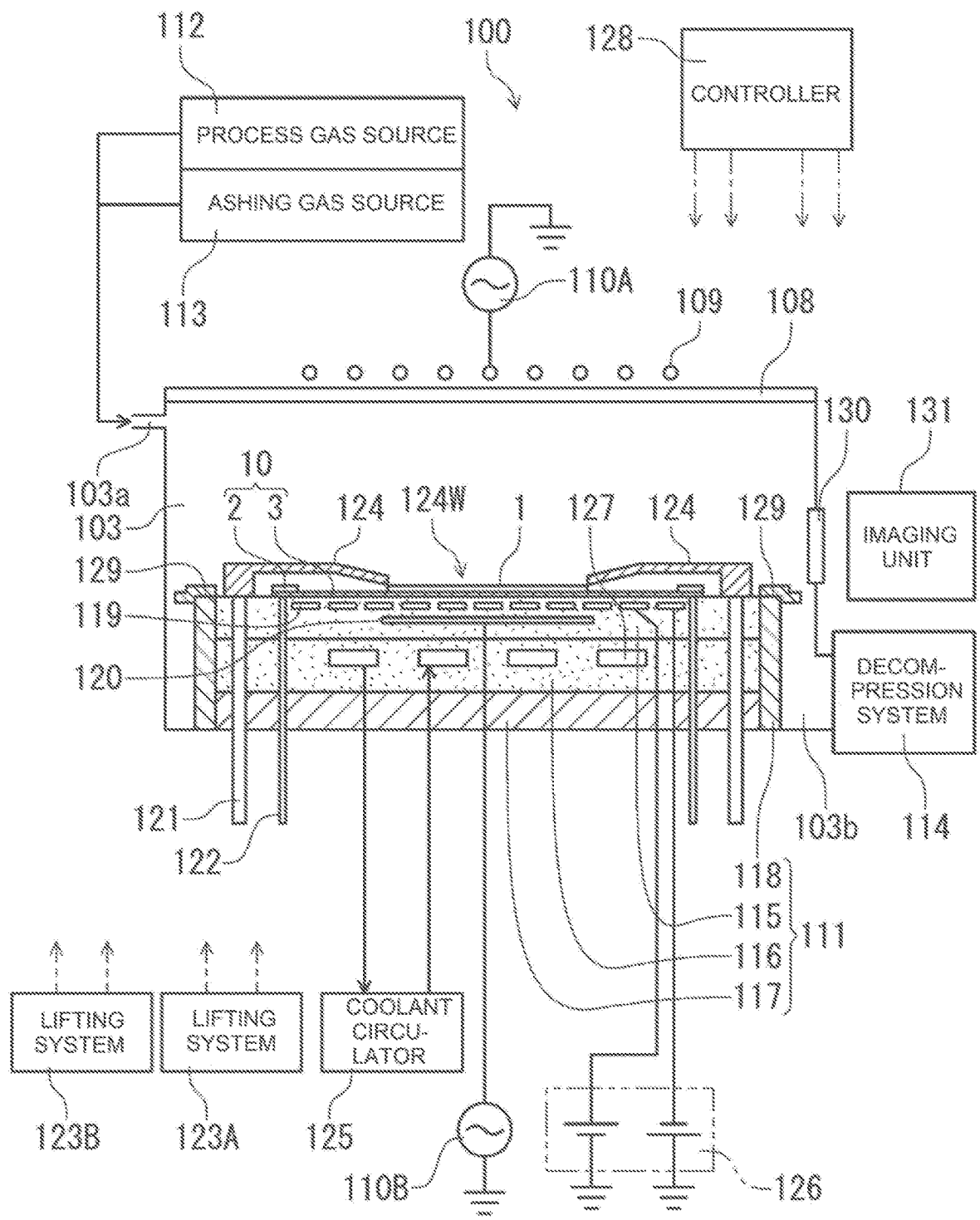
FIG. 2 is a conceptual cross-sectional diagram showing the fundamental structure of a plasma processing apparatus according to an embodiment of the present invention.

Next, referring to FIG. 2, the fundamental structure of a plasma processing apparatus 100 according to an embodiment of the present invention will be described. FIG. 2 schematically illustrates the fundamental structure of the plasma processing apparatus 100 according to an embodiment of the present invention.

The plasma processing apparatus 100 includes a stage 111. A conveying carrier 10 is placed on the stage 111, with a surface holding a substrate 1 of a holding sheet 3 faced upward. The stage 111 has such a size that the whole conveying carrier 10 can be placed thereon. Above the stage 111, a cover 124 that covers the frame 2 and at least part of the holding sheet 3 and has a window area 124W for exposing at least part of the substrate 1 therefrom is disposed.

The stage 111 and the cover 124 are disposed in a processing chamber (vacuum chamber 103). The vacuum chamber 103 is approximately cylindrical in shape, with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, an antenna 109 serving as an upper electrode is disposed. The antenna 109 is electrically connected to a first high-frequency power source 110A. The stage 111 is disposed on the bottom side in the vacuum chamber 103.

The vacuum chamber 103 is provided with a gas inlet 103a and a gas outlet 103b. The gas inlet 103a is connected to plasma-generating gas supply sources, i.e., a process gas source 112 and an ashing gas source 113, each through a conduit. The gas outlet 103b is connected to a decompression system 114 including a vacuum pump for exhausting gas from the vacuum chamber 103 to reduce the pressure therein.

The vacuum chamber 103 has a window 130 provided in a side surface, on the lateral side of the conveying carrier 10. The window 130 is made of, for example, transparent glass, and through the window 130, the placed state of the conveying carrier 10 on the stage 111 can be visually confirmed.

An imaging unit 131 is disposed in proximity to the window 130 of the vacuum chamber 103. The imaging unit 131 is, for example, a CCD camera. The imaging unit 131 captures an image of the conveying carrier 10 (e.g., a region including the inner peripheral sidewall of the frame 2) through the window 130, to acquire an image data. The imaging area preferably includes a facing region corresponding to the inner peripheral sidewall of the frame 2 and facing the window 130. By image analyzing the image data (esp. the facing region in the imaged region) acquired by the imaging unit 131, it is possible to determine whether the placed state of the conveying carrier 10 on the stage 111 is good or not. The determination of whether the placed state is good or not can be done by a determination unit provided in a later-described controller 128 (control unit).

The stage 111 includes an electrode layer 115, a metal layer 116, and a base table 117 supporting the electrode layer 115 and the metal layer 116, each being approximately circular. The stage 111 further includes a circumferential part 118 surrounding the electrode layer 115, the metal layer 116, and the base table 117. The circumferential part 118 is formed of a metal having electrical conductivity and etching resistance, and serves to protect the electrode layer 115, the metal layer 116, and the base table 117 from plasma. On the top surface of the circumferential part 118, an annular circumferential ring 129 is disposed. The circumferential ring 129 serves to protect the top surface of the circumferential part 118 from plasma. The electrode layer 115 and the circumferential ring 129 are formed of, for example, the dielectric material as mentioned above.

Within the electrode layer 115, there disposed are an ESC electrode 119 constituting an electrostatic chuck system, and a high-frequency electrode part 120 electrically connected to a second high-frequency power source 110B. The ESC electrode 119 is electrically connected to a DC power source 126. The electrostatic chuck system is composed of the ESC electrode 119 and the DC power source 126. By the electrostatic chuck system, the holding sheet 3 is pressed against the stage 111 and secured thereto. Although a description will be given below of a case where the electrostatic chuck system is used for securing the holding sheet 3 to the stage 111, this should not be taken as a limitation. A clamp (not shown) may be used for securing the holding sheet 3 to the stage 111.

The metal layer 116 is formed of, for example, aluminum with anodic oxidation coating. The metal layer 116 contains a coolant channel 127 configured to cool the stage 111. As the stage 111 is cooled down, the holding sheet 3 placed on the stage 111 is cooled down, and the cover 124 partially in contact with the stage 111 is also cooled down. This can prevent the substrate 1 and the holding sheet 3 from being damaged by heating in the plasma processing. A coolant in the coolant channel 127 is circulated by a coolant circulator 125.

The stage 111 is provided at near its periphery with a plurality of supports 122 disposed through the stage 111. The supports 122 are driven to move up and down by a lifting system 123A. The conveying carrier 10 is delivered into the vacuum chamber 103 and passed onto the supports 122 that have been raised to a predetermined position. The supports 122 support the frame 2 of the conveying carrier 10. Then, the supports 122 are lowered until their top surfaces become flush with or below the top surface of the stage 111. The conveying carrier 10 is thus placed at a predetermined position on the stage 111.

A plurality of lifting rods 121 are coupled to the cover 124 at its end, so that the cover 124 can be raised and lowered. The lifting rods 121 are driven to move up and down by a lifting system 123B. The lifting and lowering operation of the cover 124 by the lifting system 123B can be controlled independently from the operation by the lifting system 123A.

The lifting rods 121 and the lifting system 123B configure the relative position change unit and operate to change the relative distance between the cover 124 and the stage 111 to a first distance d1 and to a second distance d2 smaller than the first distance d1. It is to be noted, however, that the method of changing of the distance by the relative position change unit is not limited to a method using the lifting rods 121.

While the distance between the cover 124 and the stage 111 is the first distance d1, the placed state of the conveying carrier 10 on the stage 111 is determined. As a result of the determination, when the placed state is determined as the first state (good), the relative position change unit lowers the cover 124, to change the distance between the cover 124 and the stage 111 to the second distance d2. Thereafter, a plasma processing is performed while the distance between the cover 124 and the stage 111 is the second distance d2.

The dielectric member 108, the antenna 109, the first high-frequency power source 110A, the second high-frequency power source 110B, the process gas source 112, the decompression system 114, and the high-frequency electrode part 120 constitute a plasma generation unit.

The controller 128 controls the operations of constituent elements of the plasma processing apparatus 100, including the first and second high-frequency power sources 110A and 110B, the process gas source 112, the ashing gas source 113, the decompression system 114, the coolant circulator 125, the lifting systems 123A and 123B, and the electrostatic chuck system. The controller 128 also has the determination unit, and controls to determine whether the placed state of the conveying carrier 10 on the stage 111 is good or not, based on an image data acquired by the imaging unit 131.

(Plasma Processing Method)

Figure 3:
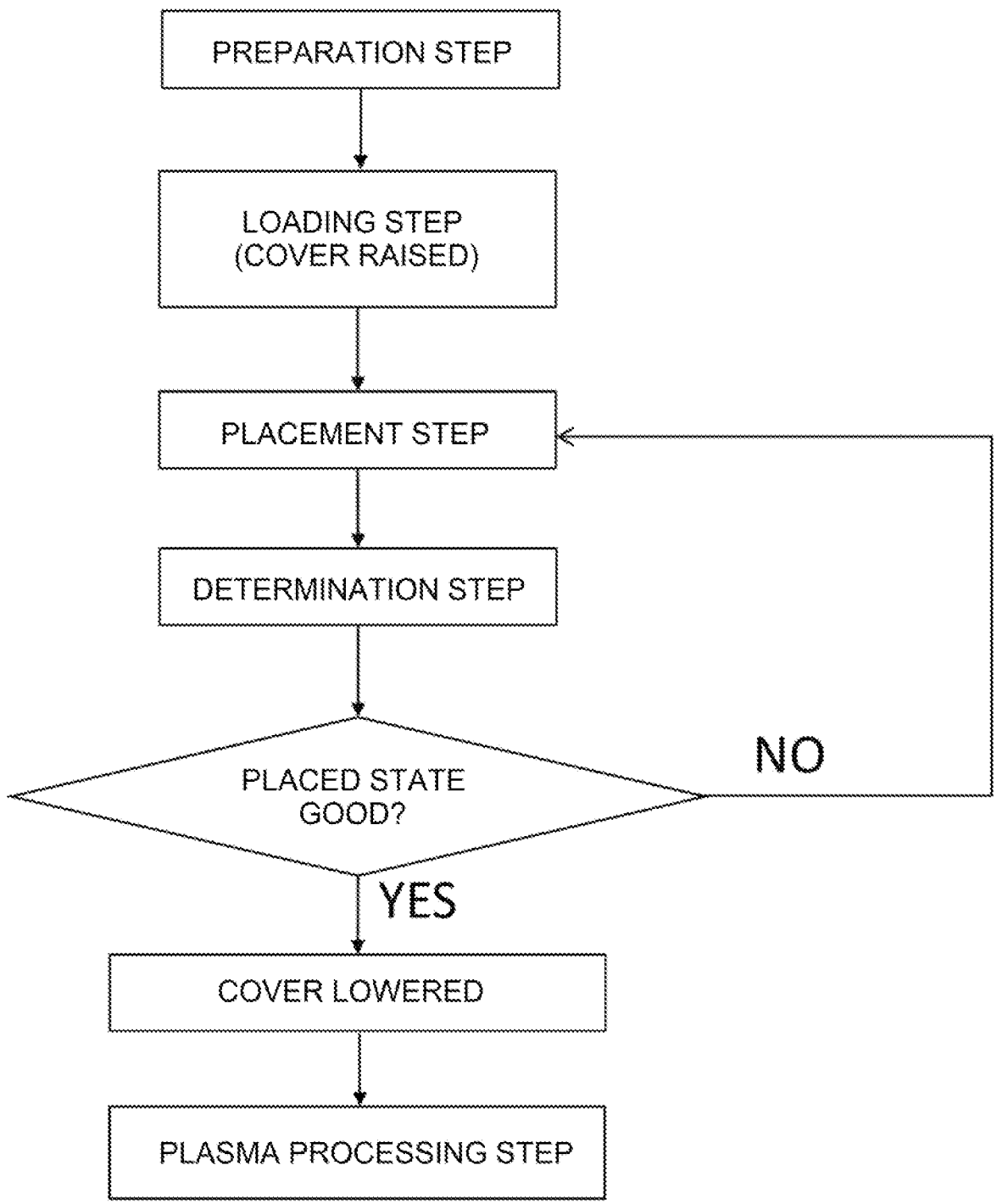
FIG. 3 is a flow chart showing some of the steps of a plasma processing method according to an embodiment of the present invention.
Figure 4:
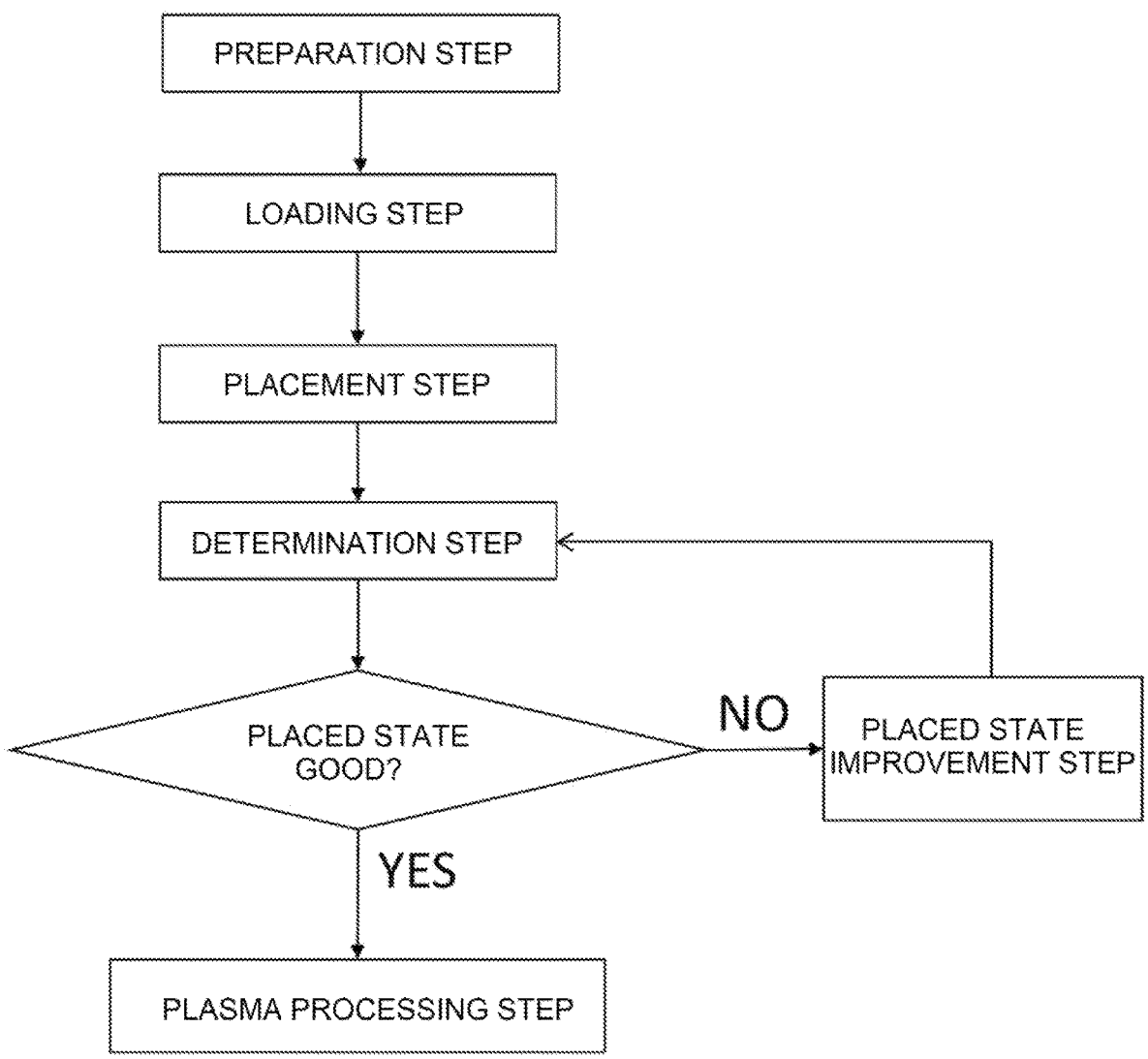
FIG. 4 is another flow chart showing some of the steps of a plasma processing method according to an embodiment of the present invention.

Next, the fundamental steps of a plasma processing method according to the present embodiment will be described with reference to FIGS. 3 to 5G. FIG. 3 is a flow chart showing some of the steps of the plasma processing method. FIG. 4 is another flow chart showing some of the steps of the plasma processing method.

FIGS. 5A to 5G are conceptual diagrams showing the positional relationship between the cover and the stage in each step of the plasma processing method. In FIGS. 5A to 5G, the circumferential part 118, the circumferential ring 129, the gas introduction route, and the like, are omitted for ease of understanding of the invention.

A plasma processing method according to one embodiment of the present invention includes: a placement step of placing a substrate held on a conveying carrier having a frame and a holding sheet, on a stage provided in a plasma processing apparatus, the plasma processing apparatus including a chamber, a plasma generation unit configured to generate a plasma in the chamber, the stage for placing the conveying carrier, and a cover for covering at least part of the conveying carrier placed on the stage; and a determination step of determining a placed state of the conveying carrier while a distance between the cover and the stage is a first distance. When the placed state is determined as being a first state in the determination step, the distance between the cover and the stage is changed to a second distance smaller than the first distance, and then, a plasma is generated in the chamber, to perform a plasma processing by irradiating the generated plasma to the substrate.

A plasma processing method according to another embodiment of the present invention includes: a placement step of placing a substrate held on a conveying carrier having a frame and a holding sheet, on a stage provided in a plasma processing apparatus, the plasma processing apparatus including a chamber, a plasma generation unit configured to generate a plasma in the chamber, and the stage having a placement surface for placing the conveying carrier; and a determination step of determining a placed state of the conveying carrier. The determination step includes an imaging step of imaging the conveying carrier placed on the stage. The imaging step is a step of imaging an imaging region from a first direction intersecting with the placement surface, through a window provided in a side surface of the chamber, by an imaging unit provided outside the chamber. The imaging region includes a facing region facing the window and corresponding to an inner peripheral sidewall of the frame of the conveying carrier placed on the stage. In the determination step, the placed state is determined based on an image data acquired in the imaging step.

(1) Preparation Step

First, a conveying carrier 10 is prepared. The conveying carrier 10 is obtained by attaching a holding sheet 3 to one surface of a frame 2 and securing it thereto. The holding sheet 3 is attached such that an adhesive side 3a faces the frame, as illustrated in FIG. 1B. Next, a substrate 1 is attached to the adhesive side 3a of the holding sheet 3, to allow the substrate 1 to be held on the conveying carrier 10.

(2) Loading Step

Next, the conveying carrier 10 with the substrate 1 held thereon is loaded into a vacuum chamber 103.

Figure 5A:
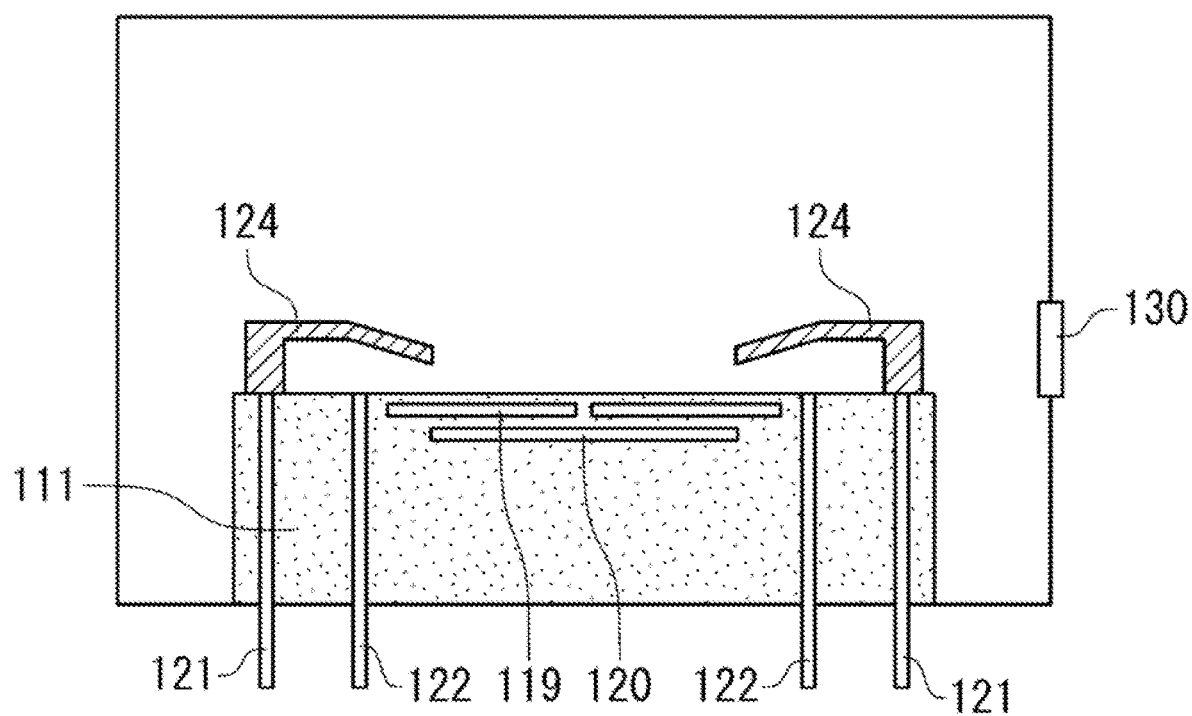
FIG. 5A is a conceptual diagram showing the positional relationship between a cover and a stage in a step of a plasma processing method according to an embodiment of the present invention.

FIG. 5A shows the positional relationship between a cover 124 and a stage 111 before loading the conveying carrier. As shown in FIG. 5A, lifting rods 121 and supports 122 are in the lowered position.

Figure 5B:
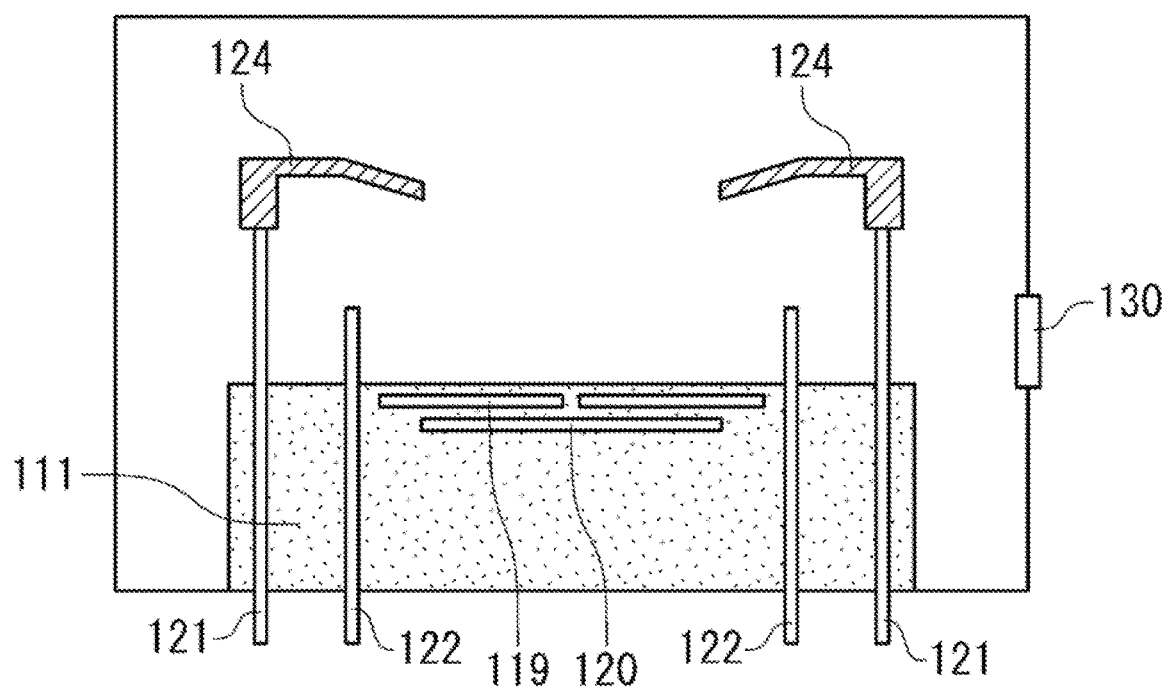
FIG. 5B is a conceptual diagram showing the positional relationship between the cover and the stage in a step of a plasma processing method according to an embodiment of the present invention.

The lifting rods 121 and the supports 122 are driven to raise the cover 124 to a predetermined position in the vacuum chamber 103, and the supports 122 are kept in standby at the raised position. FIG. 5B shows the positional relationship between the cover 124 and the stage 111 at this time. The distance between the cover 124 and the stage 111 at this time is a first distance d1.

Figure 5C:
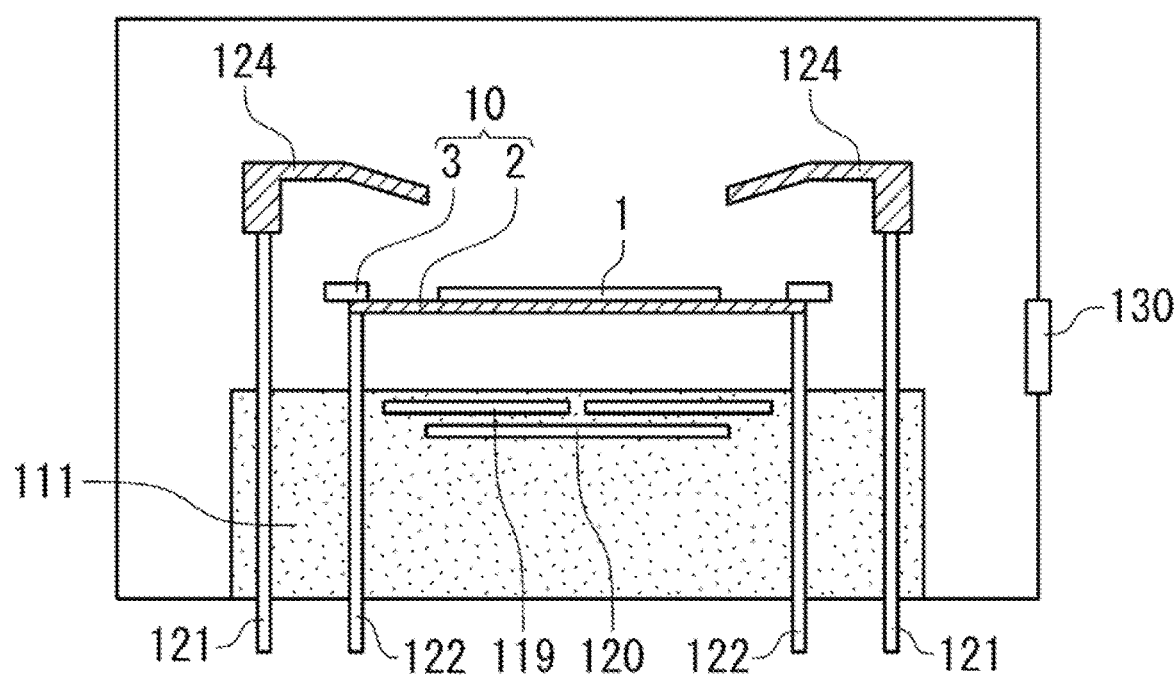
FIG. 5C is a conceptual diagram showing the positional relationship between the cover and the stage in a step of a plasma processing method according to an embodiment of the present invention.

Subsequently, a shutter (not shown) is opened, and the conveying carrier 10 held by a transfer arm is carried into the vacuum chamber 103 by the transfer arm. When the conveying carrier 10 reaches a predetermined position above the stage 111, the conveying carrier 10 is transferred onto the supports 122. The conveying carrier 10 is placed on the upper end surfaces of the supports 122 such that the surface of the holding sheet 3 holding the substrate 1 faces upward. FIG. 5C shows the positional relationship between the cover 124 and the stage 111 at this time.

(3) Placement Step

Figure 5D:
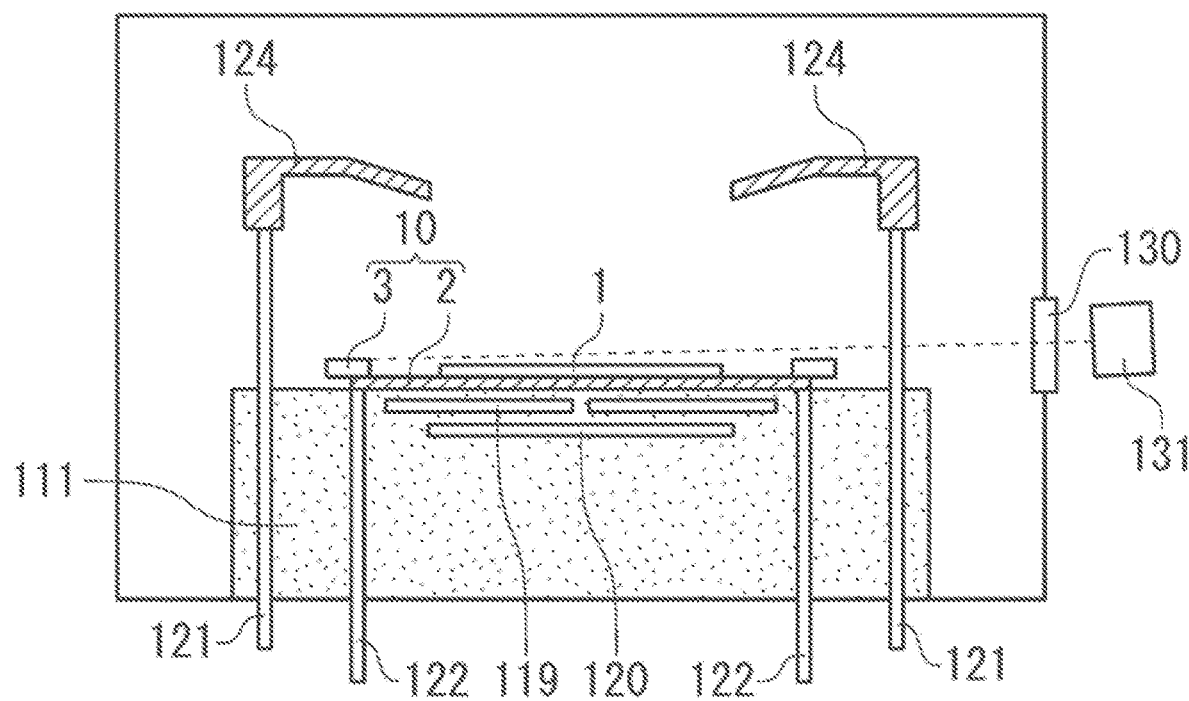
FIG. 5D is a conceptual diagram showing the positional relationship between the cover and the stage in a step of a plasma processing method according to an embodiment of the present invention, in which the placed state of a conveying carrier is a first state (good).

Upon completion of the transfer of the conveying carrier 10 onto the supports 122, the transfer arm is withdrawn, and the shutter is closed, to place the vacuum chamber 103 in a sealed state. Then, the supports 122 are lowered. When the supports 122 are lowered until their upper end surfaces become flush with or lower than the stage 111, the conveying carrier 10 is placed on the stage 111. FIG. 5D shows the positional relationship between the cover 124 and the stage 111 at this time. Since the cover 124 is not yet lowered, the distance between the cover 124 and the stage 111 remains the first distance d1.

Subsequently, the conveying carrier 10 placed on the stage 111 is secured onto the stage 111. When the stage 111 includes an ESC electrode 119, by applying a voltage to the ESC electrode 119, a chucking force is generated between the holding sheet 3 of the conveying carrier 10 and the stage 111, and thus, the holding sheet 3 and further, the conveying carrier 10 can be secured onto the stage 111.

The ESC electrode 119 is roughly classified into two types: a monopolar type and a bipolar type.

The monopolar ESC electrode 119 includes at least one electrode. When the monopolar ESC electrode 119 includes two or more electrodes, voltages with the same polarity are applied to all of them. The electrostatic chuck system including the monopolar ESC electrode 119 uses Coulomb force as a chucking mechanism. By applying a voltage to the ESC electrode 119, an electric charge due to dielectric polarization is induced on the surface of the stage 111 made of a dielectric, and the holding sheet 3 placed on the stage 111 is electrostatically charged. As a result, Coulomb force acts between the electric charge induced on the surface of the stage 111 and the electrostatically charged holding sheet 3, so that the conveying carrier 10 is chucked onto the stage 111. In order to allow the holding sheet 3 to be electrostatically charged, a plasma is generated in the vacuum chamber 103, and the holding sheet 3 is exposed to the generated plasma.

On the other hand, the bipolar ESC electrode 119 includes a positive electrode and a negative electrode, and voltages with different polarities are applied respectively to the positive electrode and the negative electrode. The bipolar ESC electrode 119 may be, for example, a comb-shaped electrode. To the positive electrode, a voltage of V1 is applied from the a DC power source 126 to the positive terminal. To the negative electrode, a voltage of −V1 is applied from the DC power source 126.

In the electrostatic chuck system including the bipolar ESC electrode 119, there are two types of force used as the chucking mechanism: Coulomb force and Johnson-Rahbek force. Depending on the chucking mechanism, the structure of the ESC electrode 119 and the material (e.g., ceramics) forming the ESC electrode 119 are appropriately selected. With either chucking mechanism, by applying voltages with different polarities respectively to the positive electrode and the negative electrode, a chucking force is generated between the ESC electrode and the holding sheet 3, and the conveying carrier 10 can be chucked onto the stage 111. In the case of the bipolar type, unlike in the case of the unipolar type, it is not necessary to allow the holding sheet 3 to be electrostatically charged, for chucking.

A bipolar ESC electrode can also function as a unipolar one, depending on how a voltage is applied to the positive electrode and the negative electrode. Specifically, by applying voltages with the same polarity to the positive electrode and the negative electrode, the bipolar ESC electrode can be used as a unipolar ESC electrode.

When the ESC electrode 119 is of bipolar type, after the conveying carrier 10 is transferred onto the supports 122, a voltage is applied to the ESC electrode 119 from the DC power source 126. This allows the holding sheet 3 to be brought into contact with the stage 111 and, simultaneously, chucked onto the stage 111. Thus, the holding sheet 3 is secured onto the stage 111. The application of a voltage to the ESC electrode 119 may be initiated after the holding sheet 3 is placed on (after coming in contact with) the stage 111.

(4) Determination Step

After the placement step, a determination step of determining the placed state of the conveying carrier is performed. Here, the placed state of the conveying carrier 10 in the vacuum chamber 103 is photographed using an imaging unit 131 through a window 130, and the image data is image-analyzed. This can determine the placed state of the holding sheet 3 on the stage 111 and, further, the state of the substrate 1 placed on the stage 111 via the holding sheet 3.

For example, as shown in FIG. 5D, the imaging unit 131, which is disposed at a position on the lateral side of the conveying carrier 10 placed on the stage 111, photographs the conveying carrier 10, from an angle slightly inclined against the placement surface of the conveying carrier (principal surface of the substrate 1). The imaging unit 131, particularly, photographs an area including the inner peripheral sidewall of the frame 2 of the conveying carrier 10 (preferably, an area facing the window 130). The imaging angle and imaging range of the imaging unit 131 are adjusted so that the image data includes the inner peripheral sidewall of the frame. Specifically, the imaging direction (first direction) of the imaging unit 131 can be set such that, when the holding sheet or the substrate has a spaced region where it is lifted and spaced from the placement surface, the angle formed between the first direction and the placement surface is to be an angle at which imaging of at least part of the facing region by the imaging unit is hindered by the holding sheet or the substrate in the spaced region. The angle formed between the placement surface of the conveying carrier and the first direction is, for example, in the range of more than 0° and 30° or less.

Figure 5E:
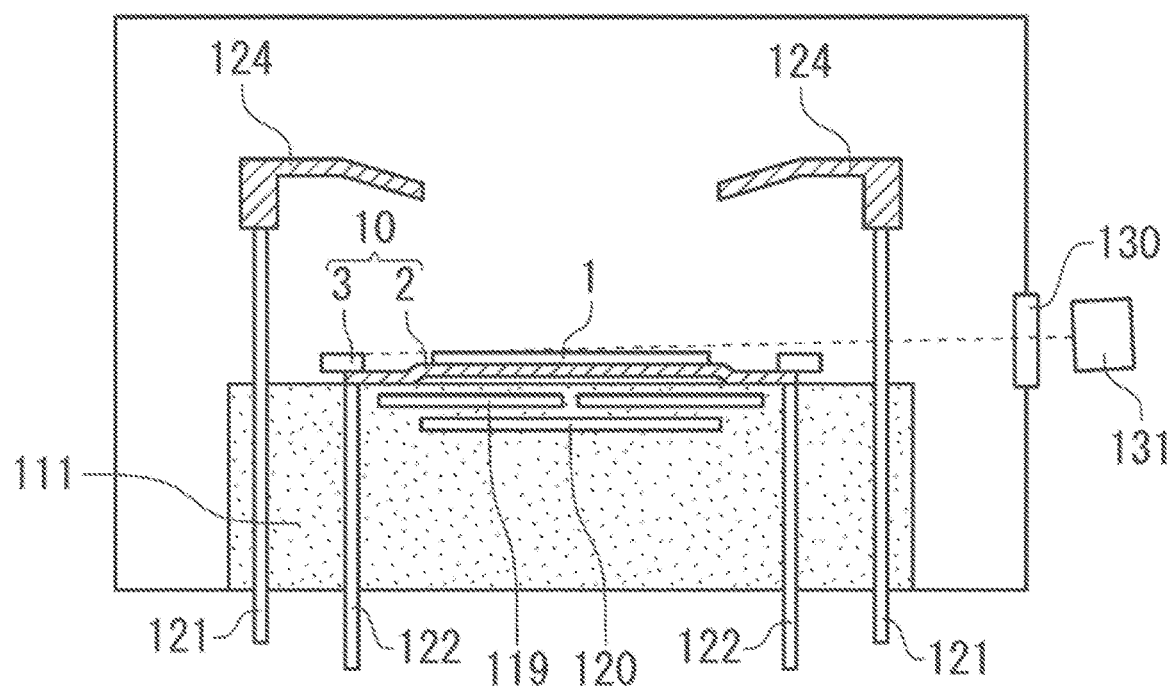
FIG. 5E is a conceptual diagram showing the positional relationship between the cover and the stage in a step of a plasma processing method according to an embodiment of the present invention, in which the placed state of the conveying carrier is a second state (defective).

As shown in FIG. 5D, when the substrate 1 or the holding sheet 3 is not lifted from the stage 111, and the placed state of the conveying carrier 10 is good (first state), the image data includes an information on the inner peripheral sidewall of the frame 2. However, for example, as shown in FIG. 5E, when the holding sheet 3 is partially wrinkled, and part of the holding sheet 3 is lifted from the stage 111 (second state), at least part of the inner peripheral sidewall of the frame 2 is hidden behind the lifted portion, and will not appear on the image data. Therefore, by determining a region (facing region) corresponding to the inner peripheral sidewall of the frame 2 from the image data by image analysis, the placed state of the conveying carrier 10 can be determined. For example, the area of the region (facing region) corresponding to the inner peripheral sidewall of the frame 2 in the image data may be determined. When the area is equal to or more than a predetermined value, the placed state can be determined as the first state (good), and when less than the predetermined value, the placed state can be determined as the second state (defective).

Figure 5F:
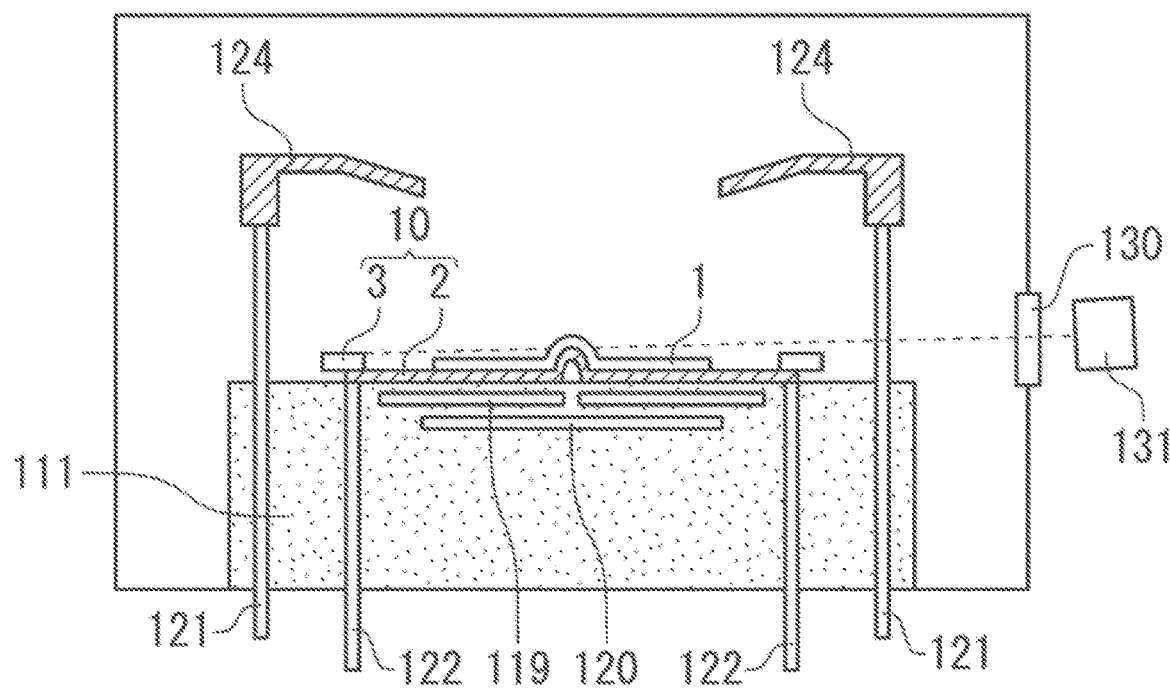
FIG. 5F is a conceptual diagram showing the positional relationship between the cover and the stage in a step of a plasma processing method according to an embodiment of the present invention, in which the placed state of the conveying carrier is the second state (defective).

Furthermore, as shown in FIG. 5F, when the substrate 1 is thin and has flexibility, if the holding sheet 3 is wrinkled, the substrate 1 held on the wrinkled portion of the holding sheet 3 may also be wrinkled. When the substrate 1 is wrinkled, this causes a change in the light reflection from the surface of the substrate 1, or a distortion in the pattern formed on the surface of the substrate 1. Therefore, the placed state of the conveying carrier 10 can be determined by obtaining an information on the surface of the substrate 1 from the image data by image analysis.

However, the method of determining the placed state of the conveying carrier is not limited to the method using the imaging unit 131 as described above. Whether the placed state of the conveying carrier is good or not can be determined by, for example, a method of providing a gas hole used for determination (hereinafter, determination gas hole) at the surface of the stage 111 facing the holding sheet 3, or by providing a displacement sensor or a temperature sensor.

In the method of providing a determination gas hole, whether the placed state of the conveying carrier is good or not can be determined based on the change in gas pressure over time during introducing a gas used for determination (hereinafter, determination gas) through the determination gas hole. When the holding sheet 3 is lifted from the stage 111, a gap is formed between the holding sheet 3 and the stage 111. On the other hand, when the placed state of the conveying carrier is good, the holding sheet 3 is in close contact with the stage 111, and the determination gas hole is blocked by the holding sheet 3. Therefore, for example, during introducing the determination gas at a constant flow rate through the determination gas hole, if there is a gap between the holding sheet 3 and the stage 111, it takes time for the pressure to reach a predetermined value. By measuring the time taken for the pressure to reach a predetermined value (or the gas pressure after a predetermined period of time has passed since the start of introduction of the determination gas), the placed state of the conveying carrier can be determined.

When a displacement sensor is used, the displacement sensor, while being attached to the transfer arm, moves above the stage 111, and measures the height of the substrate which is held on the conveying carrier placed on the stage. The displacement sensor is not limited, but is preferably of a non-contact type. Examples of the non-contact type displacement sensor include optical (laser), eddy current, and ultrasonic displacement sensors. When a temperature sensor is used, the stage is cooled to a predetermined temperature (e.g., −10° C. or lower), to measure the surface temperature of the substrate 1 placed on the stage. When the placed state of the conveying carrier is the first state (good), the surface temperature of the substrate 1 is uniformly low, but on the other hand, when there is a portion where the holding sheet 3 is lifted from the stage 111 (the second state), the temperature of the portion increases. The temperature sensor is not limited, but is preferably of a non-contact type. Examples of the non-contact type temperature sensor include a radiation thermometer that measures infrared radiant energy. The radiation thermometer is installed, for example, outside the vacuum chamber 103 so as to face a viewing window provided above the vacuum chamber 103.

When the placed state of the conveying carrier 10 on the stage 111 is determined as being the first state (good), the step proceeds to a later-described plasma etching step. On the other hand, when the placed state of the conveying carrier 10 on the stage 111 is determined as being the second state (defective), the conveying carrier 10 is unloaded from the vacuum chamber 103, and then, the placement step is retried. Alternatively, the supports 122 are raised again, and the placement step is retried from the state in which the conveying carrier 10 is distanced from the stage 111. In retrying, during raising or lowering of the supports 122, the supports 122 may be slightly moved up and down. By this, the wrinkles in the holding sheet 3 can be straightened, and the lifted portion of the holding sheet tends to be eliminated.

When the placed state of the conveying carrier 10 is determined as being the second state (defective) in the determination step, an improvement step of improving the placed state may be performed before the conveying carrier 10 is unloaded from the vacuum chamber 103. In the improvement step, for example, voltage application to the ESC electrode 119 is intermittently performed, to repeat the generation of a chucking force and stop of the generation a plurality times. The generation of a chucking force and the stop of the generation may be repeated a plurality of times, while a plasma is generated in the vacuum chamber 103. The applied voltage (absolute value of the voltage applied to the positive electrode and the negative electrode) V1 to the ESC electrode 119 in the improvement step is, for example, about 2500 V. For example, application of voltage for 1 second and non-application of voltage for 1 second are alternately repeated. In the case of generating a plasma, for example, Ar gas is supplied into the vacuum chamber 103, and a high-frequency power of 100 to 500 W having a frequency of 13.56 MHz is supplied to the antenna 109.

After the improvement step, the determination step may be performed again to determine the placed state of the conveying carrier. In the determination step after the improvement step, when the placed state of the conveying carrier 10 on the stage 111 is determined as being the first state (good), the step proceeds to the later-described plasma etching step. On the other hand, when the placed state of the conveying carrier 10 on the stage 111 is still determined as being the second state (defective) in the determination step after the improvement step, the improvement step may be performed again.

When the placed state is still determined as being the second state (defective) despite performing the improvement step a plurality of time, the conveying carrier 10 is unloaded from the vacuum chamber 103, and then, the placement step is retried. Alternatively, the supports 122 are raised again, and the placement step is retried from the state in which the conveying carrier 10 is distanced from the stage 111.

In the determination step, the determination of the placed state of the conveying carrier is performed, while the distance between the cover 124 and the stage 111 is the first distance d1, with the cover 124 being at a raised position, so that the imaging of the facing region by the imaging unit 131 will not be hindered by the cover 124. In this case, the determination of the placed state of the conveying carrier is done, with the cover sufficiently distanced from the conveying carrier. This can prevent the occurrence of errors in subsequent processing that may occur when the placed state is defective. For example, it is possible to avoid a conveying error that may occur when the placed state is defective, due to contacting with the cover, in unloading the conveying carrier. As a result, the substrate yield and the production efficiency can be further improved.

(5) Plasma Processing Step

Figure 5G:
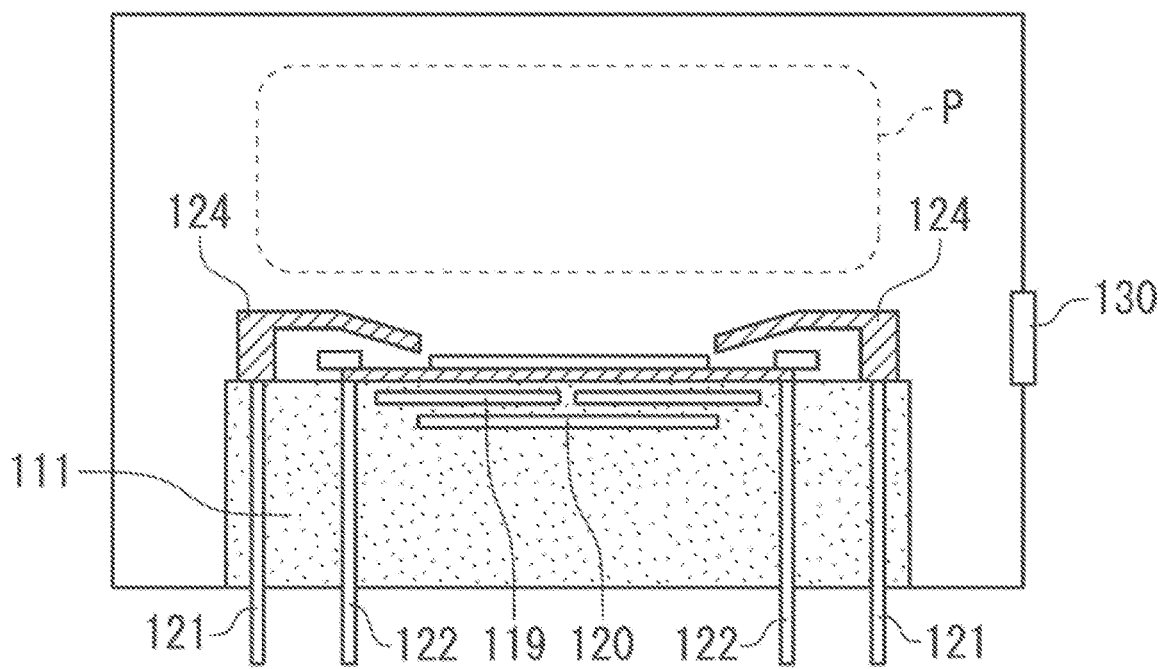
FIG. 5G is a conceptual diagram showing the positional relationship between the cover and the stage in a step of a plasma processing method according to an embodiment of the present invention.

In the determination process, if the above placed state is determined as good, the lifting rods 121 are driven to lower the cover 124 to a predetermined position. This changes the distance between the cover 124 and the stage 111 to a second distance d2 smaller than the first distance d1. FIG. 5G shows the positional relationship between the cover 124 and the stage 111 at this time. The second distance d2 is adjusted to a distance within which the cover 124 can cover the frame 2 without contacting the holding sheet 3. In this way, the frame 2 and part of the portion where the holding sheet 3 does not hold the substrate 1 are covered with the cover 124, and the substrate 1 is exposed from the window area 124W of the cover 124. The second distance d2 is, although not limited to, for example, about 0.5 mm to 1.5 mm. The second distance d2 is the shortest distance measured between the stage 111 and a portion of the cover 124 facing the holding sheet of the conveying carrier placed on the stage 111.

The cover 124 has, for example, a doughnut-like shape with approximately circular contour, and has a certain width and a thin thickness. The inner diameter of the cover 124 (the diameter of the window area 124W) is smaller than the inner diameter of the frame 2, and the outer diameter of the cover 124 is larger than the outer diameter of the frame 2. Therefore, when the cover 124 is lowered while the conveying carrier 10 is placed at a predetermined position on the stage, the cover 124 can cover the frame 2 and at least part of the holding sheet 3. From the window area 124W, at least part of the substrate 1 is exposed. The cover 124 is constituted of, for example, a dielectric, such as ceramics (e.g., alumina, aluminum nitride) and quartz, or a metal, such as aluminum or aluminum with an anodic oxidation coating.

When the supports 122 and the cover 124 are positioned at predetermined positions, a process gas is introduced into the vacuum chamber 103 from the process gas source 112 through the gas inlet 103a. On the other hand, the decompression system 114 exhausts the gas within the vacuum chamber 103 through the gas outlet 103b, to maintain the pressure inside the vacuum chamber 103 at a predetermined level. Subsequently, a high-frequency power is supplied to the antenna 109 from the first high-frequency power source 110A to generate a plasma P in the vacuum chamber 103. The generated plasma P is composed of ions, electrons, radicals, and the like. Portions exposed from the resist mask formed on the substrate 1 are removed (etched) from the front to the back side thereof, through a physicochemical reaction with the generated plasma P. Thus, the substrate 1 is singulated.

Here, for example, a high-frequency power of 100 kHz or higher may be supplied to the high-frequency electrode part 120 from the second high-frequency power source 110B. The energy of ions incident on the substrate 1 can be controlled by the high-frequency power applied to the high-frequency electrode part 120 from the second high-frequency power source 110B. When a high-frequency power is supplied to the second electrode part 120, a bias voltage is generated on the surface of the stage 111, and this bias voltage accelerates the ions incident on the substrate 1, to increase the etching rate.

The etching conditions (conditions for generating plasma) may be set depending on the material of the substrate 1 and the like. For example, when the substrate 1 is made of Si, the substrate 1 may be etched by generating a plasma in the vacuum chamber 103 using sulfur hexafluoride ($SF_6$) as a source material. In this case, for example, while $SF_6$ gas is supplied at a rate of 100 to 800 sccm from the process gas source 112, the pressure in the vacuum chamber 103 is controlled to 10 to 50 Pa by the decompression system 114. At this time, a high-frequency power of 1000 to 5000 W having a frequency of 13.56 MHz is supplied to the antenna 109, and a high-frequency power of 50 to 1000 W having a frequency of 100 kHz or higher (e.g., 400 to 500 kHz, or, 13.56 MHz) is supplied to the high-frequency electrode part 120.

In order to suppress the rise in temperature of the conveying carrier 10 during etching, the temperature of the coolant circulated in the stage 111 by the coolant circulator 125 is preferably set to the range of −20 to 20° C. By setting like this, the temperature of the holding sheet 3 during plasma processing can be controlled to, for example, 60° C. or lower, as long as the holding sheet 3 and the stage 111 are well in contact with each other. Therefore, thermal damage to the holding sheet 3 can be suppressed.

In the case of plasma dicing, desirably, the surface of the substrate 1 exposed from the resist mask is etched vertically. In this case, an etching step using a plasma of a fluorine-based gas, such as $SF_6$, as described above, and a protective film deposition step using a plasma of a fluorocarbon gas, such as perfluorocyclobutane ($C_4F_8$), may be alternately repeated.

After the substrate 1 is singulated by etching, ashing is performed. A process gas for ashing (e.g., oxygen gas, mixed gas of oxygen gas and fluorine-containing gas) is introduced from the ashing gas source 113 into the vacuum chamber 103. On the other hand, the gas within the vacuum chamber 103 is exhausted by the decompression system 114, to maintain the pressure therein at a predetermined level. By supplying a high-frequency power from the first high-frequency power source 110A, oxygen plasma is generated in the vacuum chamber 103, and the resist mask on the surface of the singulated substrate 1 (electronic components) exposed from the window area 124W of the cover 124 is completely removed.

(6) Unloading Step

When the ashing ends, the gas in the vacuum chamber 103 is evacuated, the shutter is opened, and the conveying carrier 10 holding the singulated substrate 1 is unloaded from the plasma processing apparatus 100 by the transfer arm. The unloading process of the conveying carrier 10 may be performed by reversely performing the procedure of loading the substrate 1 on the stage 111 as described above. That is, after the cover 124 is raised to a predetermined position, the voltage applied to the ESC electrode 119 is switched to zero, to release the chucking of the conveying carrier 10 to the stage 111, and raise the supports 122. After the supports 122 are raised to a predetermined position, the conveying carrier 10 is unloaded.

The plasma processing method of the present invention is useful when plasma processing is performed using a plasma processing apparatus having a cover above the stage.

REFERENCE NUMERALS

1: substrate
2: frame, 2a: notch, 2b: corner cut
3: holding sheet, 3a: adhesive side, 3b: non-adhesive side
10: conveying carrier
100: plasma processing apparatus
103: vacuum chamber, 103a: gas inlet, 103b: gas outlet, 108: dielectric member, 109: antenna,
110A: first high-frequency power source, 110B: second high-frequency power source, 111: stage,
112: process gas source, 113: ashing gas source, 114: decompression system, 115: electrode layer, 116: metal layer, 117: base table, 118: circumferential part, 119: ESC electrode, 120: high-frequency electrode part, 121: lifting rod, 122: support, 123A, 123B: lifting system, 124: cover, 124W: window area, 125: coolant circulator, 126: DC power source, 127: coolant channel, 128: controller, 129: circumferential ring
130: window, 131: imaging unit

What is claimed is:

1. A plasma processing apparatus for performing a plasma processing on a substrate held on a conveying carrier having a frame and a holding sheet, the plasma processing apparatus comprising:
a chamber;
a plasma generation unit configured to generate a plasma in the chamber;
a stage for placing the conveying carrier, the stage provided in the chamber;
a cover for covering at least part of the conveying carrier placed on the stage;
an imaging unit configured to image the conveying carrier placed on the stage;
a relative position change unit capable of changing a relative distance between the cover and the stage to a first distance and to a second distance smaller than the first distance;
a determination unit configured to determine a placed state of the conveying carrier; and
a control unit configured to control the plasma generation unit and the relative position change unit, wherein
the determination unit determines the placed state of the conveying carrier, based on an image data acquired by the imaging unit while the distance between the cover and the stage is the first distance, and
the plasma processing is performed while the distance between the cover and the stage is the second distance.

2. The plasma processing apparatus according to claim 1, wherein the determination unit determines the placed state, based on a condition of an inner peripheral sidewall of the frame in the image data.

3. The plasma processing apparatus according to claim 1, wherein
when the placed state is determined as being a first state by the determination unit,
the control unit controls the relative position change unit so as to change the distance between the cover and the stage to the second distance, and then controls the plasma generation unit so as to generate the plasma.

4. The plasma processing apparatus according to claim 1, wherein
when the placed state is determined as being a second state by the determination unit,
the control unit controls to place the conveying carrier on the stage again while the distance between the cover and the stage is greater than the second distance.

5. A plasma processing method, comprising:
a placement step of placing a substrate held on a conveying carrier having a frame and a holding sheet, on a stage provided in a plasma processing apparatus, the plasma processing apparatus including a chamber, a plasma generation unit configured to generate a plasma in the chamber, the stage for placing the conveying carrier, and a cover for covering at least part of the conveying carrier placed on the stage; and
a determination step of determining a placed state of the conveying carrier while a distance between the cover and the stage is a first distance, wherein
when the placed state is determined as being a first state in the determination step,
the distance between the cover and the stage is changed to a second distance smaller than the first distance, and then, a plasma is generated in the chamber, to perform a plasma processing by irradiating the generated plasma to the substrate, and wherein
the determination step includes an imaging step of imaging the conveying carrier placed on the stage while the distance between the cover and the stage is the first distance, and
the placed state is determined based on an image data acquired in the imaging step.

6. The plasma processing method according to claim 5, wherein in the determination step, the placed state is determined based on a condition of an inner peripheral sidewall of the frame in the image data.

7. A plasma processing apparatus for performing a plasma processing on a substrate held on a conveying carrier having a frame and a holding sheet, the plasma processing apparatus comprising:
a chamber;
a plasma generation unit configured to generate a plasma in the chamber;
a stage provided in the chamber and having a placement surface for placing the conveying carrier;
an imaging unit provided outside the chamber and configured to image an imaging region from a first direction intersecting with the placement surface, through a window provided in a side surface of the chamber, the imaging region including a facing region facing the window and corresponding to an inner peripheral sidewall of the frame of the conveying carrier placed on the stage;

a control unit configured to control the plasma generation unit and the imaging unit; and a determination unit configured to determine a placed state of the conveying carrier, based on an image data acquired by the imaging unit.

8. The plasma processing apparatus according to claim 7, wherein the first direction is set such that when the holding sheet or the substrate has a spaced region where the holding sheet or the substrate is lifted and spaced from the placement surface, imaging of at least part of the facing region by the imaging unit is hindered by the spaced region, and the determination unit determines the placed state of the conveying carrier, based on an information on the facing region included in the image data.

9. The plasma processing apparatus according to claim 7, wherein the imaging region includes a surface of the substrate held on the conveying carrier, and the determination unit determines the placed state of the conveying carrier, based on an information on the surface included in the image data.

10. The plasma processing apparatus according to claim 7, wherein the control unit, when the placed state of the conveying carrier is determined as being a first state by the determination unit, controls to execute the plasma generation unit so as to generate a plasma, and when the placed state of the conveying carrier is determined as being a second state by the determination unit, controls to execute an improvement operation of the placed state.

11. The plasma processing apparatus according to claim 10, wherein after the improvement operation, the control unit controls to execute again the imaging of the imaging region by the imaging unit and the determination of the placed state of the conveying carrier based on the image data by the determination unit.

12. The plasma processing apparatus according to claim 10, further comprising a chuck system for generating a chucking force on the placement surface, wherein the improvement operation includes repeating the generation of a chucking force by the chuck system and stop of the generation a plurality of times.

13. A plasma processing method, comprising:

a placement step of placing a substrate held on a conveying carrier having a frame and a holding sheet, on a stage provided in a plasma processing apparatus, the plasma processing apparatus including a chamber, a plasma generation unit configured to generate a plasma in the chamber, and the stage having a placement surface for placing the conveying carrier; and a determination step of determining a placed state of the conveying carrier, wherein the determination step includes an imaging step of imaging the conveying carrier placed on the stage, the imaging step is a step of imaging an imaging region from a first direction intersecting with the placement surface, through a window provided in a side surface of the chamber, by an imaging unit provided outside the chamber, the imaging region including a facing region facing the window and corresponding to an inner peripheral sidewall of the frame of the conveying carrier placed on the stage, and in the determination step, the placed state of the conveying carrier is determined based on an image data acquired in the imaging step.

14. The plasma processing method according to claim 13, wherein the first direction is set such that when the holding sheet or the substrate has a spaced region where the holding sheet or the substrate is lifted and spaced from the placement surface, imaging of at least part of the facing region by the imaging unit is hindered by the spaced region, and in the determination step, the placed state of the conveying carrier is determined based on an information on the facing region included in the image data.

15. The plasma processing method according to claim 13, wherein the imaging region includes a surface of the substrate held on the conveying carrier, and in the determination step, the placed state of the conveying carrier is determined based on an information on the surface included in the image data.

* * * * *